(12) United States Patent
Kim et al.

(10) Patent No.: US 11,251,333 B2
(45) Date of Patent: Feb. 15, 2022

(54) DISPLAY APPARATUS

(71) Applicant: SAMSUNG ELECTRONICS CO., LTD., Suwon-si (KR)

(72) Inventors: Byung Chul Kim, Suwon-si (KR); Dong Yeob Lee, Suwon-si (KR); Seung Ryong Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 5 days.

(21) Appl. No.: 16/730,375

(22) Filed: Dec. 30, 2019

(65) Prior Publication Data

US 2020/0220041 A1 Jul. 9, 2020

(30) Foreign Application Priority Data

Jan. 4, 2019 (KR) ........................ 10-2019-0001178

(51) Int. Cl.
*H01L 33/00* (2010.01)
*G06F 1/16* (2006.01)
*H01L 25/075* (2006.01)

(52) U.S. Cl.
CPC ........ *H01L 33/0095* (2013.01); *G06F 1/1607* (2013.01); *H01L 25/0753* (2013.01)

(58) Field of Classification Search
CPC combination set(s) only.
See application file for complete search history.

(56) References Cited

U.S. PATENT DOCUMENTS

| | | | |
|---|---|---|---|
| 8,482,696 | B1 | 7/2013 | Byeon et al. |
| 2010/0073912 | A1* | 3/2010 | Shinozaki ......... G02F 1/133603 362/97.1 |
| 2012/0092585 | A1* | 4/2012 | Byeon .................. H05K 5/0017 349/58 |
| 2015/0355495 | A1* | 12/2015 | Yoon .................. G02F 1/133308 349/58 |
| 2016/0343949 | A1* | 11/2016 | Seo ..................... H01L 51/0072 |
| 2016/0370892 | A1* | 12/2016 | Chang ................. G06F 3/04164 |
| 2017/0140679 | A1 | 5/2017 | Tomoda et al. |
| 2017/0162824 | A1* | 6/2017 | Paek ................... H01L 51/5246 |
| 2017/0345350 | A1 | 11/2017 | Topousis et al. |

(Continued)

FOREIGN PATENT DOCUMENTS

| | | |
|---|---|---|
| JP | 2009-003151 A | 1/2009 |
| JP | 5366180 B2 | 12/2013 |
| JP | 6345380 B1 | 6/2018 |

(Continued)

OTHER PUBLICATIONS

International Search Report dated Apr. 29, 2020 issued by the International Searching Authority in counterpart International Application No. PCT/KR2019/018698 (PCT/ISA/210).

(Continued)

*Primary Examiner* — Kyoung Lee
(74) *Attorney, Agent, or Firm* — Sughrue Mion, PLLC

(57) ABSTRACT

Provided is a display apparatus including a chassis and a display panel installed on the chassis. The display panel includes a substrate and an inorganic light emitting element. The chassis includes a base plate including a mounting groove, and a bracket coupled to and received in the mounting groove. A rear surface of the substrate is attached to the bracket through an adhesive member.

16 Claims, 10 Drawing Sheets

(56) References Cited

U.S. PATENT DOCUMENTS

2019/0327843 A1* 10/2019 Chang .................. H05K 5/0247
2020/0042969 A1*  2/2020 Ray ........................ G07F 9/026

FOREIGN PATENT DOCUMENTS

| KR | 10-2004-0024376 A |  3/2004 |
| KR |    10-0930375 B1  | 12/2009 |
| KR | 10-2010-0073607 A |  7/2010 |
| KR |    10-1191834 B1  | 10/2012 |
| KR |    10-1846352 B1  |  4/2018 |
| KR | 10-2018-0066493 A |  6/2018 |

OTHER PUBLICATIONS

Communication dated Nov. 3, 2021, issued by the European Patent Office in European Application No. 19906741.4.

* cited by examiner

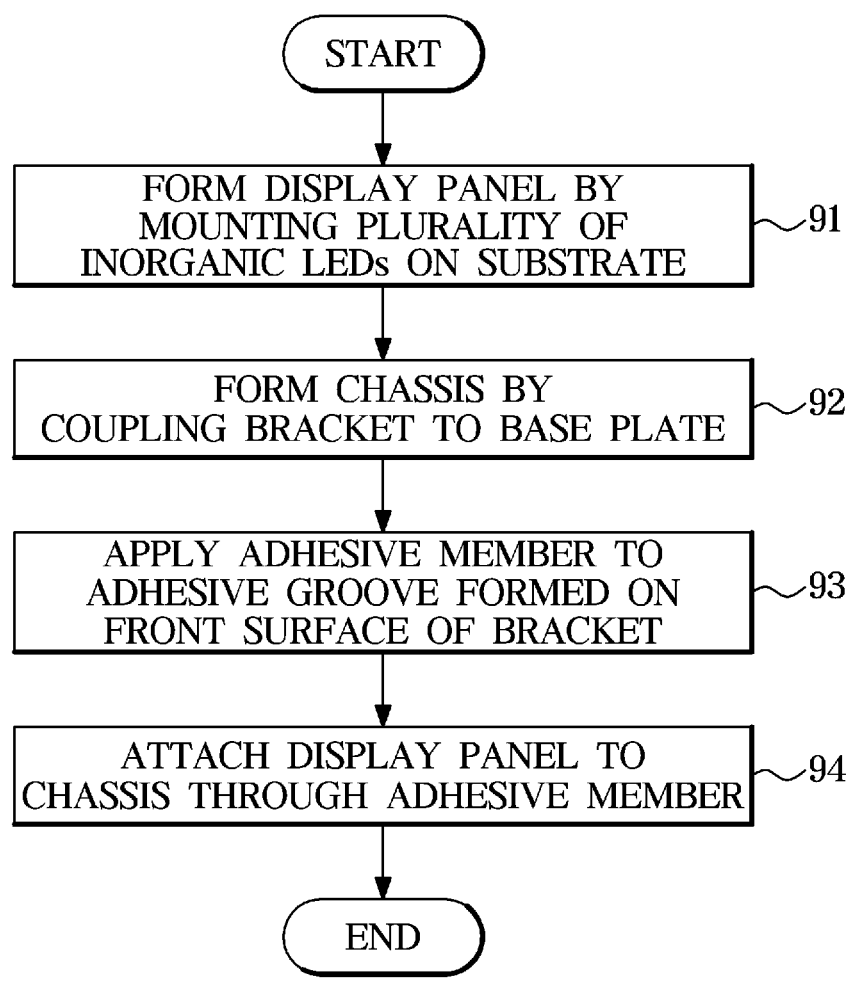

DISPLAY APPARATUS

CROSS-REFERENCE TO RELATED APPLICATION(S)

This application is based on and claims priority under 35 U.S.C. § 119 to Korean Patent Application No. 10-2019-0001178, filed on Jan. 4, 2019, in the Korean Intellectual Property Office, the disclosure of which is incorporated by reference herein in its entirety.

BACKGROUND

1. Field

The disclosure relates to a display apparatus including a plurality of display panels formed by mounting a plurality of inorganic light emitting elements on a substrate, and more particularly, to a structure for installing a plurality of display panels to a chassis.

2. Description of Related Art

A display apparatus is an output apparatus that visually displays data information such as characters, graphics, images, etc. In general, a liquid crystal panel and an organic light emitting diode (OLED) panel are widely used as a display panel in a display apparatus.

Demand continues to grow for display apparatuses with high brightness, high resolution, high efficiency, low power, etc. Research is being conducted on inorganic LED panels formed by transferring a plurality of inorganic LEDs directly from a wafer onto a substrate in order to replace or supplement the liquid crystal panel and the OLED panel.

The inorganic LED panel is easy to make a large sized screen by applying a modular technology. That is, the large sized screen may be made by modularizing the inorganic LED panel to a small size and continuously tiling up, down, left, and right.

SUMMARY

Provided is a display apparatus in which a plurality of display panels is assembled on a chassis to form a single screen, and in which a structure for installing the plurality of display panels to the chassis is improved.

Additional aspects will be set forth in part in the description which follows and, in part, will be apparent from the description, or may be learned by practice of the presented embodiments.

In accordance with an aspect of the disclosure, there is provided a display apparatus including a chassis and a display panel installed on the chassis, wherein the display panel includes a substrate and an inorganic light emitting element mounted on the substrate, and the chassis includes a base plate including a mounting groove, and a bracket coupled to and received in the mounting groove, and a rear surface of the substrate is attached to the bracket by an adhesive member.

The mounting groove may be provided on a front surface of the base plate.

An entirety of the bracket may be received in the mounting groove so that the bracket does not protrude from the mounting groove.

A depth of the mounting groove may be greater than or equal to a thickness of the bracket.

The substrate may be supported on a front surface of the base plate.

The display apparatus may further include a fastening member configured to couple the bracket to the base plate.

The bracket may include an adhesive groove provided on a front surface of the bracket to receive the adhesive member.

The adhesive member may include an ultraviolet curable resin.

The display apparatus may further include a plurality of display panels including the display panel, and the plurality of display panels may be installed at a front surface of the chassis in a matrix arrangement.

The bracket may have a rod shape.

The display apparatus may further include a plurality of brackets including the bracket, and the plurality of brackets may be disposed to correspond to a top side, a bottom side, a left side and a right side of the substrate, respectively.

The base plate may include alignment marks provided on a front surface of the base plate and recognizable by a sensing device to guide a position of the display panel when the display panel may be installed on the chassis.

In accordance with an aspect of the disclosure, there is provided method of manufacturing a display apparatus, the method including: forming a display panel by mounting a plurality of inorganic light emitting elements on a substrate; forming a chassis by coupling a bracket to a base plate; applying an adhesive member to an adhesive groove provided on a front surface of the bracket; and attaching the display panel to the chassis through the adhesive member.

The forming the display panel may include transferring the plurality of inorganic light emitting elements from a wafer to onto the substrate.

The forming the chassis may include fastening a fastening member to a through hole provided in the base plate and a fastening hole provided in the bracket.

The forming the chassis may include coupling the bracket to a mounting groove formed on a front surface of the base plate to receive the bracket in the mounting groove.

The attaching the display panel to the chassis may include aligning a position of the display panel by recognizing alignment marks provided on the front surface of the base plate with a sensing device.

BRIEF DESCRIPTION OF THE DRAWINGS

The above and other aspects, features, and advantages of certain embodiments of the disclosure will become more apparent from the following description taken in conjunction with the accompanying drawings, in which:

FIG. 10 is a flowchart illustrating a method of manufacturing the display apparatus according to an embodiment.

DETAILED DESCRIPTION

Figure 1:
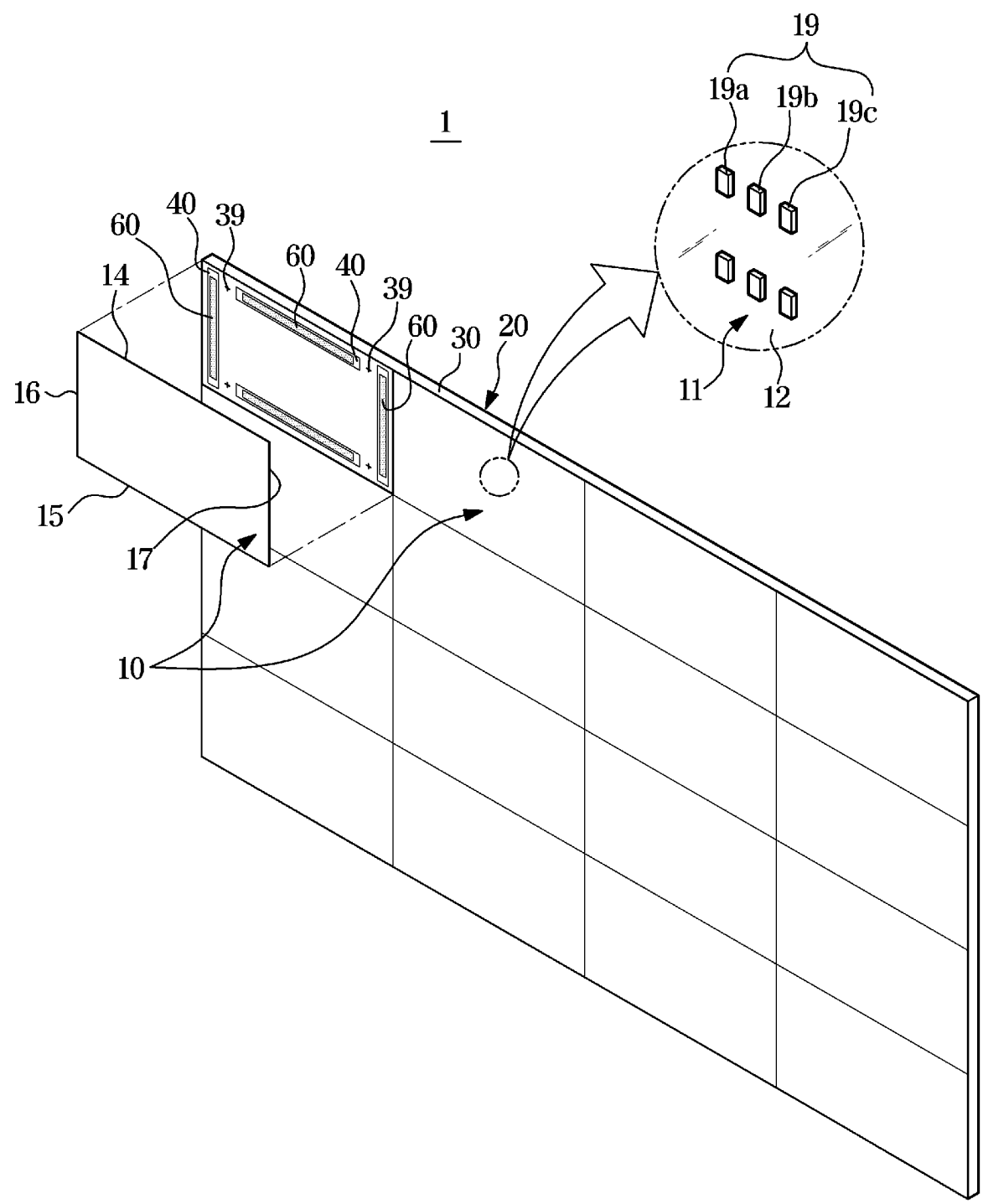
FIG. 1 is a view illustrating a display apparatus according to an embodiment.

The embodiments described herein and the configurations shown in the drawings are only examples the disclosure, and various modifications may be made to the embodiments and drawings of the disclosure.

The singular forms used in the description may include the plural forms unless the context clearly indicates otherwise. The shape and size of the elements in the drawings may be exaggerated for clarity.

The terms "includes" and "has" are intended to indicate that there are features, numbers, steps, operations, elements, parts, or combinations thereof described in the specification, and do not exclude the presence or addition of one or more other features, numbers, steps, operations, elements, parts, or combinations thereof, unless a specific contrary meaning is described.

Hereinafter embodiments of the disclosure will be described in detail with reference to the accompanying drawings.

FIG. 1 is a view illustrating a display apparatus according to an embodiment.

Referring to FIG. 1, a display apparatus 1, which is a device that displays information, materials, data, and the like as text, graphics, graphs, images, and the like, includes a television (TV), a personal computer (PC), a mobile, a digital signage, and the like. The display apparatus 1 may be installed on a horizontal surface by using a stand or installed on a wall.

The display apparatus 1 may include a chassis 20 and a plurality of display panels 10 installed on a front surface of the chassis 20 to display an image. The chassis 20 may support the plurality of display panels 10.

The plurality of display panels 10 may be arranged in the form of an M×N matrix vertically and horizontally. Although the drawing illustrates an example in which sixteen of the display panels 10 are coupled to the chassis 20 in the form of a 4×4 matrix, the number or arrangement of the display panels 10 is not limited and may be variously determined.

Each of the display panels 10 may include a substrate 11 and a plurality of inorganic light emitting elements mounted on the substrate 11.

The substrate 11 may be formed of a material such as polyimide (PI), National Electrical Manufacturers Association (NEMA) flame retardant 4 grade (FR-4), glass, or the like. A pixel electrode to which inorganic light emitting diodes (LEDs) 19a. 19b, and 19c are electrically connected and a driving layer including a thin film transistor (TFT) are formed on a mounting surface 12 of the substrate 11.

The inorganic light emitting elements may include the inorganic LEDs 19a. 19b, and 19c. The inorganic LEDs 19a, 19b, and 19c may be formed of an inorganic material such as silicon (Si), sapphire, and/or gallium nitride (GaN). The inorganic LEDs 19a, 19b, and 19c are more resistant to oxygen and moisture as compared to an organic light emitting diode (OLED) formed of an organic material, and thus may have a long lifespan and excellent power efficiency.

The inorganic LEDs 19a, 19b, 19c may be picked up from a source wafer and mounted directly on the substrate 11. The inorganic LEDs 19a. 19b, and 19c may be picked up and transferred through an electrostatic method using an electrostatic head or an adhesive method using an elastic polymer material such as polydimethylsiloxane (PDMS) or silicon as a head. The width, length, and height of the inorganic LEDs 19a, 19b, and 19c may be in the sizes of several micrometers (μm) to several hundred micrometers (μm).

The inorganic LEDs 19a, 19b, and 19c may include a p-n diode, a first contact electrode, and a second contact electrode. The inorganic LEDs 19a, 19b, and 19c may have a flip chip shape in which the first contact electrode and the second contact electrode are arranged in the same direction. The first contact electrode and the second contact electrode of the inorganic LEDs 19a, 19b, and 19c may be connected to electrodes of the substrate 11 through soldering.

The inorganic LEDs 19a. 19b, and 19c may include the red inorganic LED 19a for generating red light, the green inorganic LED 19b for generating green light, and the blue inorganic LED 19c for generating blue light.

One of the red inorganic LED 19a, one of the green inorganic LED 19b, and one of the blue inorganic LED 19c may form an LED group 19. One LED group 19 may form one pixel. That is, the red inorganic LED 19a, the green inorganic LED 19b, and the blue inorganic LED 19c form a red subpixel, a green subpixel, and a blue subpixel, respectively, and these subpixels may be gathered to form one pixel.

Although the drawing illustrates an example in which the red inorganic LED 19a, the green inorganic LED 19b, and the blue inorganic LED 19c are arranged in a line, the red inorganic LED 19a, the green inorganic LED 19b, and the blue inorganic LED 19c may be arranged in a triangular form or in various other forms.

The spacing between the LED groups 19 may be formed to be constant. The spacing between the LED groups 19 may be variously determined according to the desired resolution and size of the display apparatus 1.

A black layer may be formed on the substrate 11 to absorb light between the inorganic LEDs 19a. 19b, and 19c. An encapsulation layer may also be formed on the substrate 11 to cover the inorganic LEDs 19a, 19b, and 19c to protect the inorganic LEDs 19a, 19b, and 19c. The encapsulations layer may be formed of a resin such as epoxy and silicon, or may be formed of an optically clear adhesive (OCA), an optically clear resin (OCR), or the like.

Figure 2:
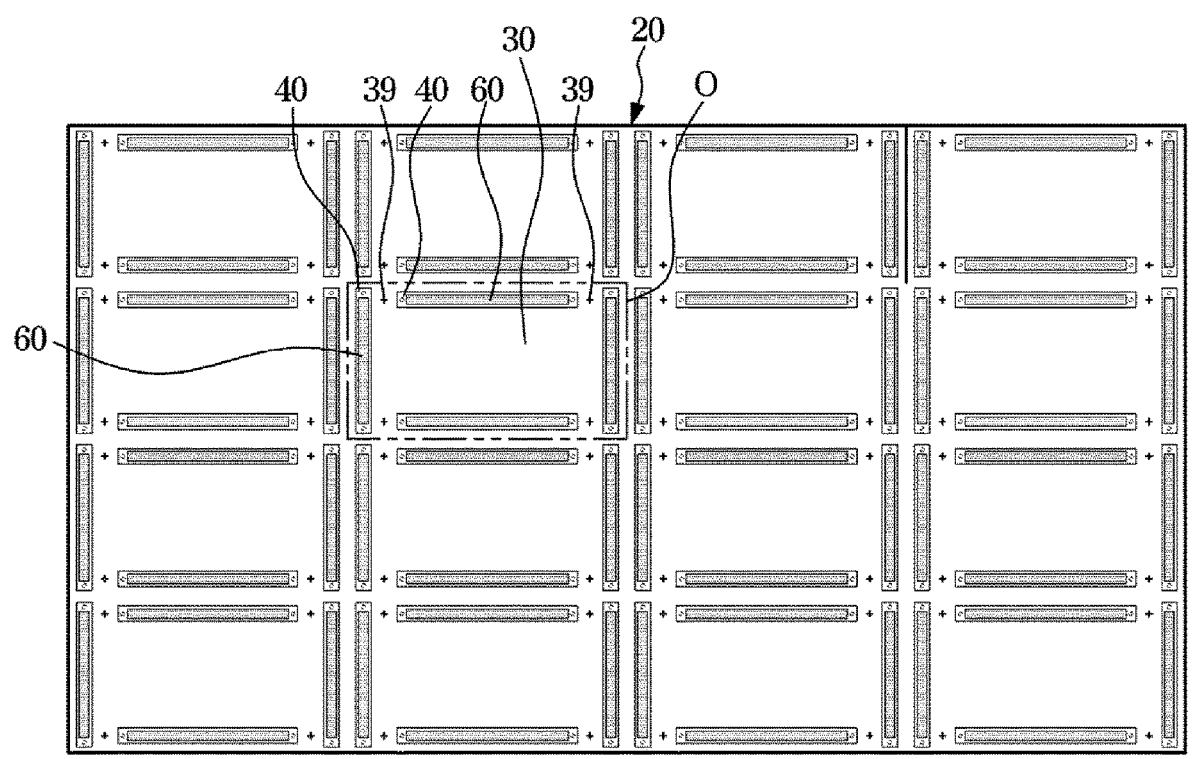
FIG. 2 is a view illustrating a chassis of the display apparatus according to an embodiment.
Figure 3:
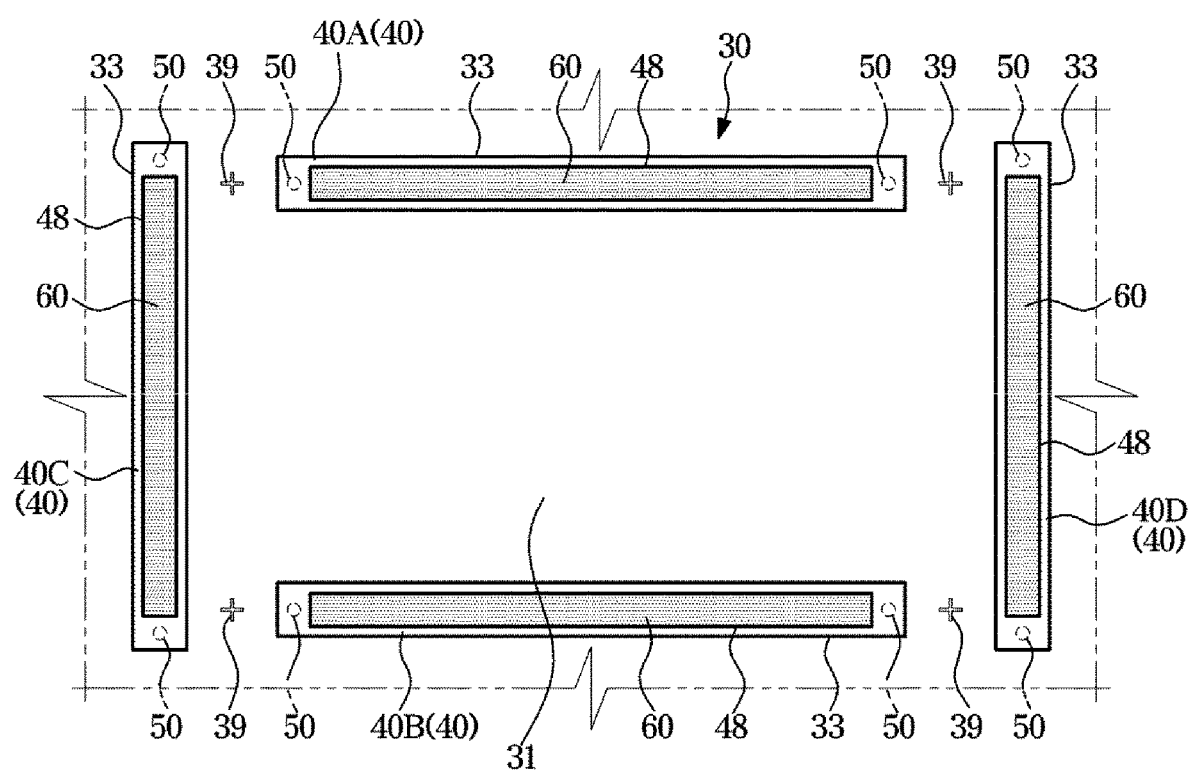
FIG. 3 is an enlarged view illustrating a portion 'O' in FIG. 2.
Figure 4:
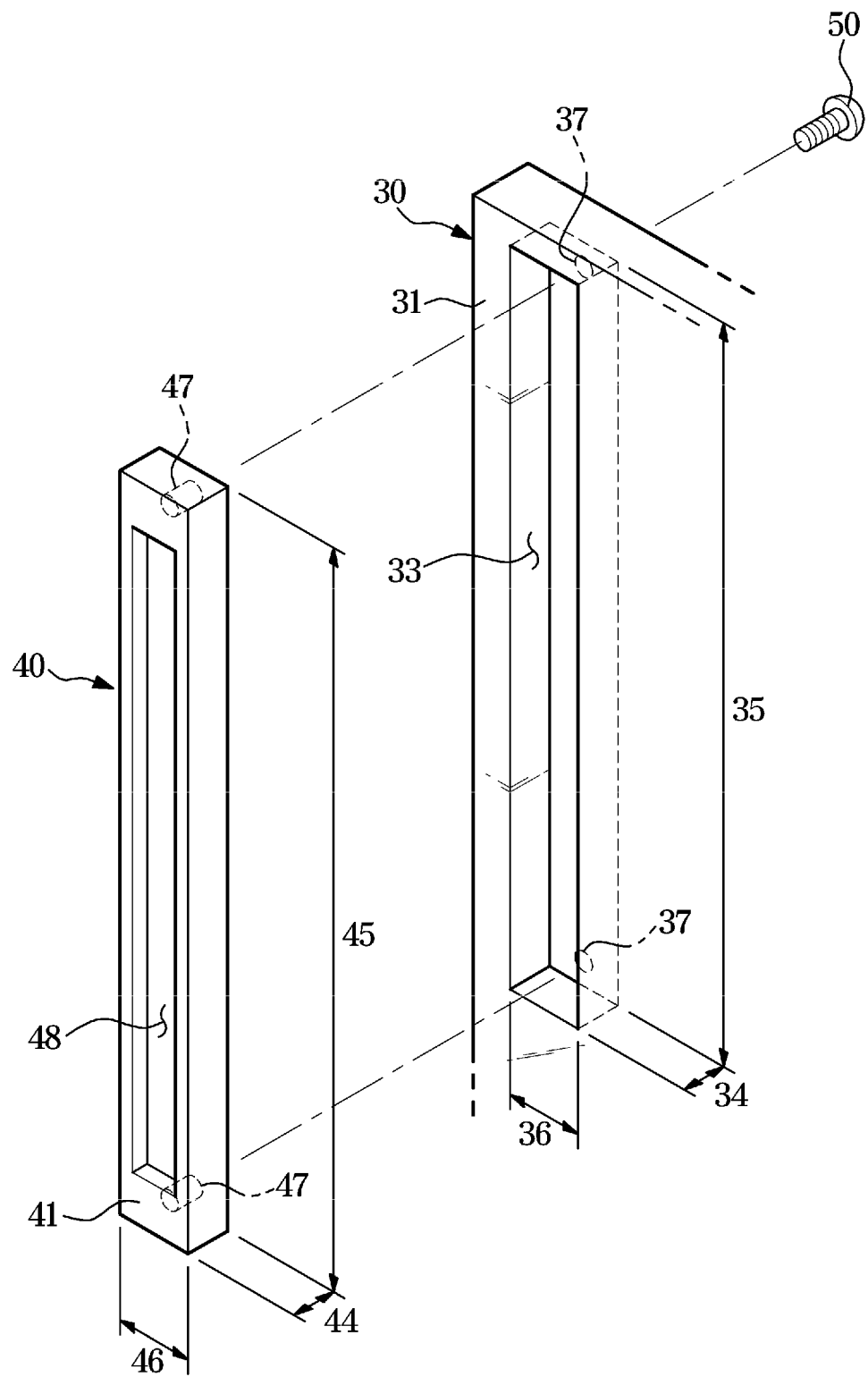
FIG. 4 is a view illustrating a mounting groove and a bracket of a base plate of the display apparatus according to an embodiment.
Figure 5:
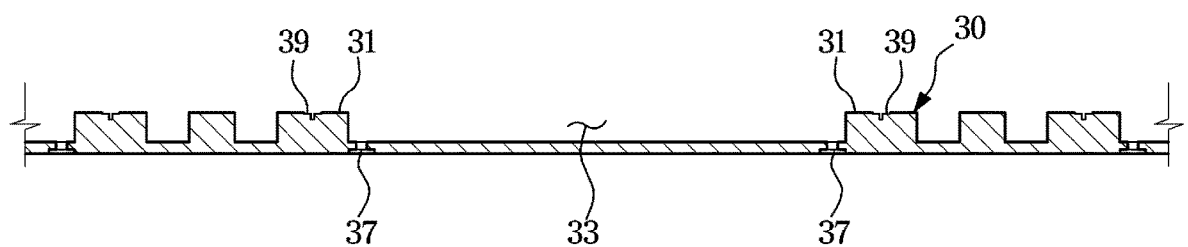
FIG. 5 is a side cross-sectional view illustrating the base plate of the display apparatus according to an embodiment.

FIG. 2 is a view illustrating a chassis of the display apparatus according to an embodiment, FIG. 3 is an enlarged view illustrating a portion 'O' in FIG. 2, and FIG. 4 is a view illustrating a mounting groove and a bracket of a base plate of the display apparatus according to an embodiment.

A structure in which display panels are attached to a chassis of the display apparatus according to an embodiment will be described with reference to FIGS. 2,3, and 4.

A chassis 20 may be formed by assembling at least one bracket 40 to a base plate 30. The at least one bracket 40 may be coupled to the base plate 30 to be independently detachable.

The base plate 30 may be formed of a metal or resin material that has appropriate rigidity. The base plate 30 may have a substantially rectangular shape. The base plate 30 may have a front surface 31 formed in a flat plane. The plurality of display panels 10 may be supported on the front surface 31 of the base plate 30. A rear surface 13 (see FIG.

8) of the plurality of display panels 10 may be in contact with and supported on the front surface 31 of the base plate 30.

At least one mounting groove 33 to which the bracket 40 is coupled may be formed on the front surface 31 of the base plate 30. The number of mounting grooves 33 may correspond to the number of brackets 40 to be coupled to the base plate 30.

The bracket 40 may be received in the mounting groove 33. Specifically, the entirety of the bracket 40 may be received in the mounting groove 33 so that no portion of the bracket 40 protrudes from the mounting groove 33. This allows the display panel 10 to be supported in contact with the front surface 31 of the base plate 30.

In particular, because all of the plurality of display panels 10 are supported on the front surface 31 of the base plate 30 formed in a flat plane, a step between the plurality of display panels 10 may not be formed.

In addition, because the bracket 40 is received flush inside the mounting groove 33, the thickness of the bracket 40 may not affect the thickness of the display apparatus 1. That is, the thickness of the display apparatus 1 does not vary regardless of whether the bracket 40 is present.

The bracket 40 may be formed in a substantially rod shape having a thickness 44, a length 45, and a width 46. The mounting groove 33 may have a depth 34, a length 35, and a width 36 to correspond to the rod shape of the bracket 40. However, the shape of the bracket 40 is not limited. Unlike the rod shape, the bracket 40 may be formed in a clamp or frame shape.

The thickness 44 of the bracket 40 may correspond to or be smaller than the depth 34 of the mounting groove 33. The length 45 of the bracket 40 may correspond to or be smaller than the length 35 of the mounting groove 33. The width 46 of the bracket 40 may correspond to or be smaller than the width 36 of the mounting groove 33.

The bracket 40 may be coupled to the base plate 30 through a fastening member 50. To this end, a through hole 37 may be formed on the base plate 30, and a fastening hole 47 may be formed on the bracket 40. The fastening member 50 may be fastened through the through hole 37 and into the fastening hole 47 when inserted toward the front of the base plate 30 from the rear of the base plate 30.

The fastening member 50 may include a screw, a bolt, and the like. The fastening member 50 may be removed from the through hole 37 and the fastening hole 47. The bracket 40 and the base plate 30 may be separated by removing the fastening member 50 from the through hole 37 and the fastening hole 47.

An adhesive groove 48 to which an adhesive member 60 is applied may be formed on a front surface 41 of the bracket 40. The adhesive member 60 may be an ultraviolet curable resin cured by ultraviolet rays. However, the adhesive member 60 is not limited thereto, and any type may be used as long as the adhesive member 60 has sufficient adhesive force such as a thermosetting resin cured by heat, etc.

The bracket 40 may be disposed to correspond to four sides (edges) of the display panel 10. Because each display panel 10 has four sides (14, 15, 16, and 17 of FIG. 1) (i.e., the top, bottom, left, and right sides, four of the brackets 40 may be coupled to each display panel 10. That is, four of the brackets 40 may be disposed to correspond to the top, bottom, left, and right sides 14, 15, 16, and 17 of the display panel 10. However, the number and arrangement of the brackets 40 are not limited thereto.

The base plate 30 may include alignment marks 39 formed on the front surface 31 of the base plate 30 to guide the position of the display panel 10 when the display panel 10 is attached to the chassis 20. The alignment marks 39 may be recognized by a sensor such as a camera, etc. Reference marks corresponding to the alignment marks 39 may be formed on the display panel 10.

Thus, by recognizing the positions of the alignment marks 39 and the reference marks through one or more sensors and calculating relative positions of the alignment marks 39 and the reference marks, the display panel 10 may be attached to a correct position of the chassis 20.

FIGS. 5, 6, 7, and 8 are side cross-sectional views sequentially illustrating operations of attaching the display panel to the chassis according to an embodiment, and FIG. 10 is a flowchart illustrating a method of manufacturing the display apparatus according to an embodiment.

A method of manufacturing the display apparatus according to an embodiment will be described with reference to FIGS. 5, 6, 7, 8, and 10.

The method of manufacturing the display apparatus 1 may include forming the display panel 10 by mounting the plurality of inorganic LEDs 19a, 19b, and 19c on the substrate 11 (operation 91).

The width, length, and height of the inorganic LEDs 19a, 19b, and 19c may be in the size of several micrometers (μm) to several hundred micrometers (μm). When the plurality of inorganic LEDs 19a, 19b, and 19c are mounted on the substrate 11, the plurality of LEDs 19a, 19b, and 19c may be picked up from the source wafer and transferred directly onto the substrate 11.

Next, the chassis 20 is formed by coupling the bracket 40 to the base plate 30 (operation 92).

Figure 6:
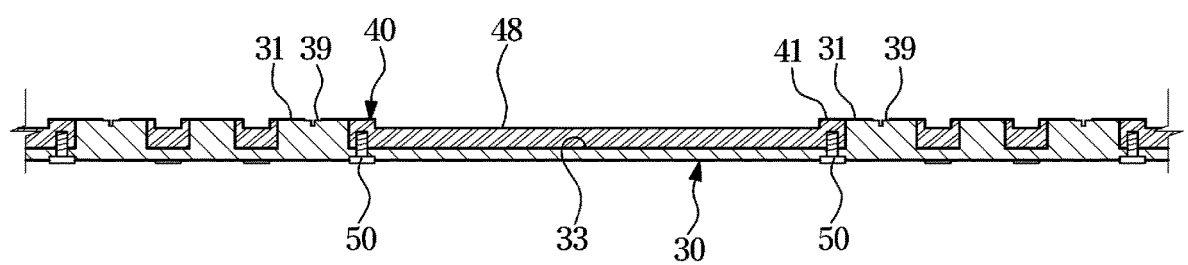
FIG. 6 is a side cross-sectional view illustrating a state in which the bracket is coupled to the base plate of the display apparatus according to an embodiment.

The base plate 30 and the bracket 40 may be coupled by a fastening member 50 such as a screw, as shown in FIG. 6. The base plate 30 and the bracket 40 may be separated by removing the fastening member 50.

The front surface 31 of the base plate 30 may be formed in a flat plane, and the mounting groove 33 into which the bracket 40 is inserted may be formed on the front surface 31 of the base plate 30. The entirety of the bracket 40 may be received in the mounting groove 33 so that no portion of the bracket 40 protrudes out of the mounting groove 33. Thus, the display panel 10 may be in contact with and supported on the front surface 31 of the base plate 30.

Figure 7:
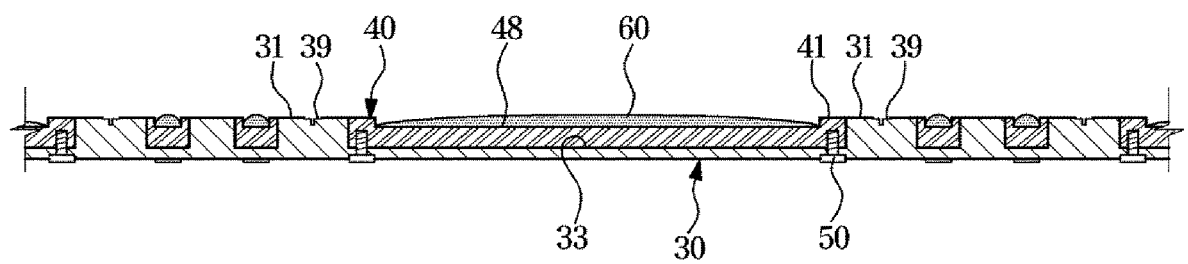
FIG. 7 is a side cross-sectional view illustrating a state in which an adhesive member is applied to the bracket of the display apparatus according to an embodiment.

Next, the adhesive member 60 is applied to the adhesive groove 48 formed on the front surface 41 of the bracket 40 (operation 93), as shown in FIG. 7. An ultraviolet curable resin, a thermosetting resin, or the like may be used as the adhesive member 60.

Figure 8:
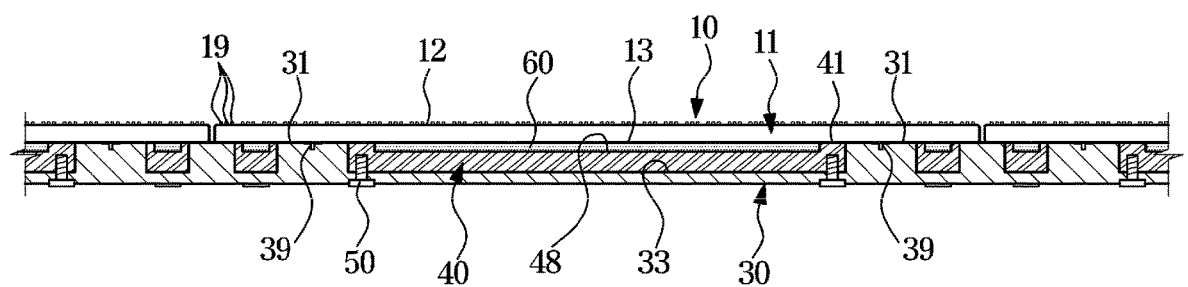
FIG. 8 is a side cross-sectional view illustrating a state in which a display panel is attached through the adhesive member to a chassis of the display apparatus according to an embodiment.

Next, the display panel 10 is attached to the chassis 20 through the adhesive member 60 (operation 94), as shown in FIG. 8. The display panel 10 is attached to the correct position by aligning, through sensors, the alignment marks 39, formed on the front surface of the base plate 30, to the reference marks of the display panel 10.

Figure 9:
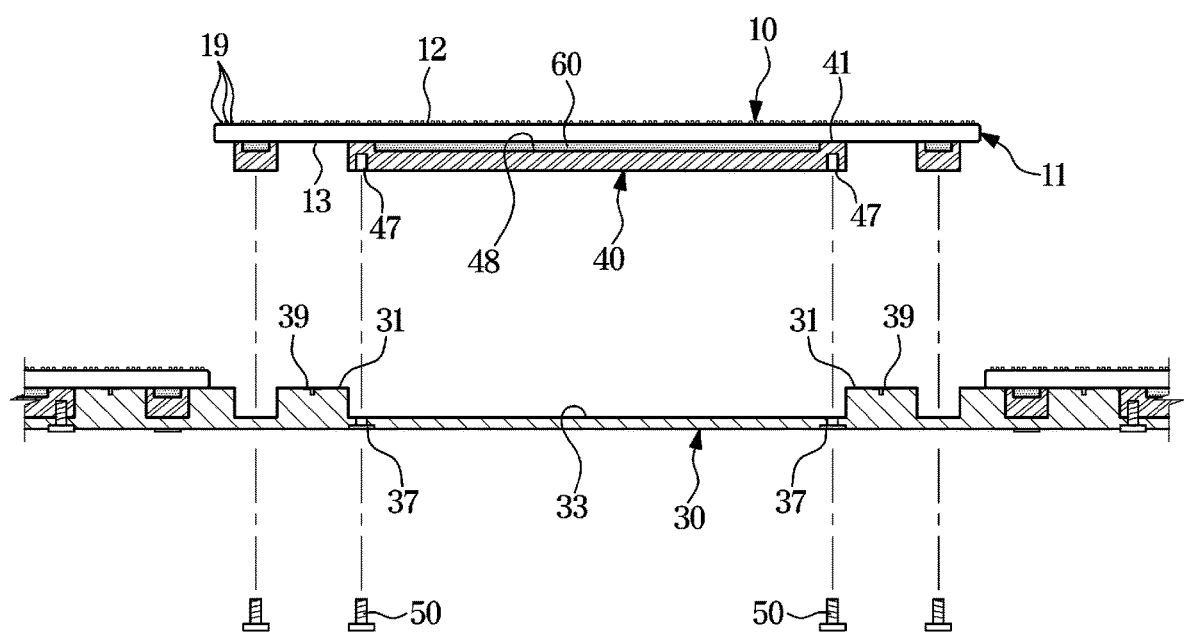
FIG. 9 is a side cross-sectional view illustrating an operation of separating a defective display panel from the chassis of the display apparatus according to an embodiment.

FIG. 9 is a side cross-sectional view illustrating an operation of separating a defective display panel from the chassis of the display apparatus according to an embodiment.

An operation of separating a defective display panel from the chassis of the display apparatus according to an embodiment will be described with reference to FIG. 9.

The display apparatus 1 according to an embodiment of the disclosure allows for display panels 10 to be separated/decoupled from the base plate 30. This is may be performed when repair or replacement of only the display panels 10 attached to the chassis 20 is required.

Specifically, the defective display panel 10 may decoupled from the base plate 30 by separating the bracket 40, to which the defective display panel 10 is attached, from the base plate 30. The bracket 40 and the base plate 30 may be separated by removing the fastening member 50 since the bracket 40 and the base plate 30 are in a state of being detachably coupled by the fastening member 50. When the bracket 40 and the base plate 30 are separated, the display panel 10 and bracket 40 are decoupled from the base plate 30.

A repaired or new display panel 10 may be coupled to the mounting groove 33 of the base plate 30 according to the method described before. As such, according to an embodiment, when a defect occurs in a display panel 10 among the plurality of display panels 10, only the defective display panel 10 may be removed for repair and replacement. Since only an individual display panel 10 is replaced without replacing all the display panels 10, the durability, reliability, and cost of the display apparatus 1 may be improved.

As is apparent from the above, according to an embodiment of the disclosure, a display panel can be installed to a chassis by attaching the display panel directly to the chassis without using an intermediate medium.

According to an embodiment, because an intermediate medium is not disposed between a base plate of the chassis and the display panel, the thickness of a display apparatus can be reduced.

According to an embodiment, because a fastening member (e.g., a screw) is not used when the display panel and the chassis are assembled, a step between the plurality of display panels due to the fastening member does not occur, and thus the image quality can be improved.

According to an embodiment, a defective display panel among the plurality of display panels installed to the chassis can be easily removed for repair and replacement.

Although a few embodiments of the disclosure have been shown and described, it will be appreciated by those skilled in the art that changes may be made to these embodiments without departing from the principles and spirit of the disclosure in the scope of which is defined in the claims and their equivalents.

What is claimed is:

1. A display apparatus comprising:
    a chassis; and
    a display panel installed on the chassis,
    wherein the display panel comprises:
       a substrate; and
       an inorganic light emitting element mounted on the substrate,
    wherein the chassis comprises:
       a base plate comprising a mounting groove; and
       a bracket coupled to and received in the mounting groove,
    wherein a rear surface of the substrate is attached to the bracket by an adhesive member, and
    wherein an entirety of the bracket is received in the mounting groove so that the bracket does not protrude from the mounting groove.

2. The display apparatus according to claim 1, wherein the mounting groove is provided on a front surface of the base plate.

3. The display apparatus according to claim 1, wherein a depth of the mounting groove is greater than or equal to a thickness of the bracket.

4. The display apparatus according to claim 1, wherein the substrate is supported on a front surface of the base plate.

5. The display apparatus according to claim 1, further comprising a fastening member configured to couple the bracket to the base plate.

6. The display apparatus according to claim 1, wherein the bracket comprises an adhesive groove provided on a front surface of the bracket to receive the adhesive member.

7. The display apparatus according to claim 1, wherein the adhesive member comprises an ultraviolet curable resin.

8. The display apparatus according to claim 1, further comprising a plurality of display panels including the display panel,
    wherein the plurality of display panels is installed at a front surface of the chassis in a matrix arrangement.

9. The display apparatus according to claim 1, wherein the bracket has a rod shape.

10. The display apparatus according to claim 1, further comprising a plurality of brackets including the bracket,
    wherein the plurality of brackets is disposed to correspond to a top side, a bottom side, a left side and a right side of the substrate, respectively.

11. The display apparatus according to claim 1, wherein the base plate comprises alignment marks provided on a front surface of the base plate and recognizable by a sensing device to guide a position of the display panel when the display panel is installed on the chassis.

12. A method of manufacturing a display apparatus, the method comprising:
    forming a display panel by mounting a plurality of inorganic light emitting elements on a substrate;
    forming a chassis by coupling a bracket to a mounting groove of a base plate;
    applying an adhesive member to an adhesive groove provided on a front surface of the bracket; and
    attaching the display panel to the chassis through the adhesive member,
    wherein an entirety of the bracket is received in the mounting groove so that the bracket does not protrude from the mounting groove.

13. The method according to claim 12, wherein the forming the display panel comprises transferring the plurality of inorganic light emitting elements from a wafer onto the substrate.

14. The method according to claim 12, wherein the forming the chassis comprises fastening a fastening member to a through hole provided in the base plate and a fastening hole provided in the bracket.

15. The method according to claim 12, wherein the forming the chassis comprises coupling the bracket to the mounting groove provided on a front surface of the base plate to receive the bracket in the mounting groove.

16. The method according to claim 12, wherein the attaching the display panel to the chassis comprises aligning a position of the display panel by recognizing alignment marks provided on the front surface of the base plate with a sensing device.

* * * * *